(12) United States Patent
Tamura et al.

(10) Patent No.: US 8,142,674 B2
(45) Date of Patent: Mar. 27, 2012

(54) PLASMA PROCESSING APPARATUS AND PLASMA PROCESSING METHOD

(75) Inventors: Hitoshi Tamura, Hikari (JP); Naoki Yasui, Kudamatsu (JP); Seiichi Watanabe, Hofu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 562 days.

(21) Appl. No.: 12/420,370

(22) Filed: Apr. 8, 2009

(65) Prior Publication Data

US 2009/0194506 A1    Aug. 6, 2009

Related U.S. Application Data

(63) Continuation of application No. 11/506,788, filed on Aug. 21, 2006, now abandoned.

(30) Foreign Application Priority Data

Feb. 22, 2006  (JP) ................. 2006-045729

(51) Int. Cl.
    H01L 21/306    (2006.01)
    B44C 1/22      (2006.01)
(52) U.S. Cl. ................. 216/61; 216/67; 427/8; 427/569
(58) Field of Classification Search .................. None
    See application file for complete search history.

(56) References Cited

U.S. PATENT DOCUMENTS

| 5,474,648 | A  | 12/1995 | Patrick |
| 5,556,549 | A  | 9/1996  | Patrick |
| 5,576,629 | A  | 11/1996 | Turner |
| 2003/0127188 | A1 | 7/2003 | Matsumoto |
| 2005/0252884 | A1 | 11/2005 | Lam |
| 2006/0278609 | A1 | 12/2006 | Hoffman |

FOREIGN PATENT DOCUMENTS

| JP | 8-124913 | 5/1996 |
| JP | 08-335567 | 12/1996 |
| JP | 2000-49216 | 2/2000 |
| JP | 2000-269195 | 9/2000 |
| JP | 2001-338917 | 12/2001 |
| JP | 2002-540616 | 11/2002 |
| JP | 2003-45846 | 2/2003 |
| JP | 2004-193564 | 7/2004 |
| JP | 2006-210415 | 8/2006 |
| JP | 2007-281205 | 10/2007 |
| WO | WO 00/58994 | 10/2000 |

*Primary Examiner* — Anita Alanko
(74) *Attorney, Agent, or Firm* — Antonelli, Terry, Stout & Kraus, LLP.

(57) ABSTRACT

The invention provides a plasma processing apparatus and a plasma processing method capable of controlling the voltage of the processing substrate with high accuracy, thereby enabling a highly accurate plasma processing. According to the invention, a voltage of the processing substrate is measured using a processing substrate with a voltage probe prepared in advance, and based on a bias voltage supplied to an electrostatic chuck mechanism and a bias current flowing through the electrostatic chuck mechanism, a capacity component which is an impedance representing the electric property of the electrostatic chuck mechanism is computed numerically. Then, based on a predetermined expression, the voltage of the processing substrate is estimated using the bias voltage of the processing substrate to be measured, the bias current flowing through the electrostatic chuck mechanism and the capacity component which is the impedance acquired in advance.

4 Claims, 4 Drawing Sheets

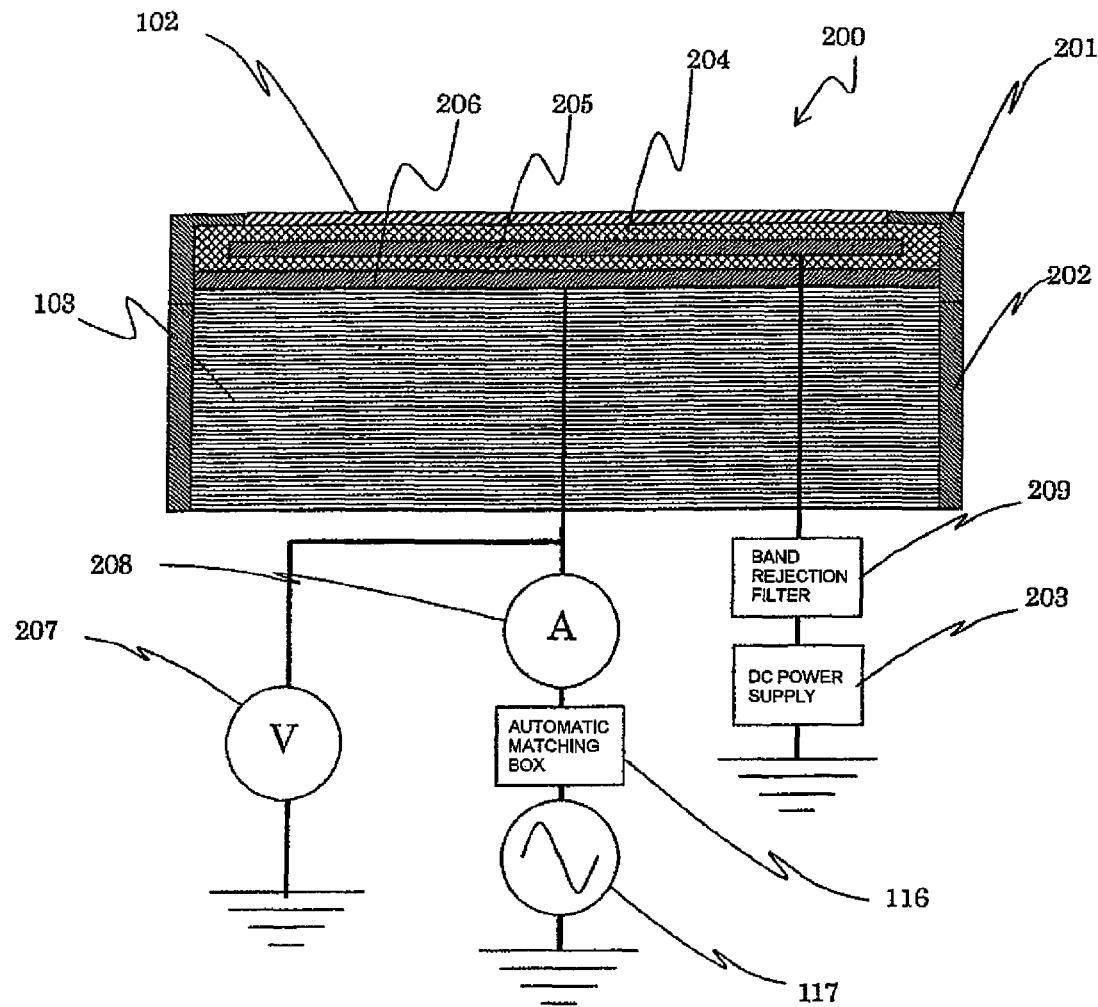

PLASMA PROCESSING APPARATUS AND PLASMA PROCESSING METHOD

CROSS REFERENCE TO RELATED APPLICATION

This application is a continuation of U.S. application Ser. No. 11/506,788, filed Aug. 21, 2006, now abandoned the contents of which are incorporated herein by reference.

The present application is based on and claims priority of Japanese patent application No. 2006-45729 filed on Feb. 22, 2006, the entire contents of which are hereby incorporated by reference.

BACKGROUND OF THE INVENTION

1. Field of the Invention

The present invention relates to a plasma processing apparatus, and more specifically, to a plasma processing apparatus and plasma processing method capable of improving the accuracy and performance of the plasma processing performed to the processing substrate.

2. Description of the Related Art

Generally, a plasma processing apparatus, especially a plasma etching apparatus, improves the performance and accuracy of the plasma processing by applying a high-frequency bias potential or bias voltage to the processing substrate and controlling the energy of ions in the plasma.

Furthermore, since the temperature of the processing substrate also influences the quality of plasma processing greatly, it is important to improve the temperature controllability of the processing substrate. In correspondence thereto, many apparatuses adopt a structure for performing highly accurate temperature control of the processing substrate by electrostatically attracting the processing substrate onto a substrate electrode and providing a temperature controlling gas between the processing substrate and the substrate electrode.

One type of plasma processing apparatus adopting the above-mentioned prior art is the plasma etching apparatus. In a plasma etching apparatus, plasma is generated in a processing chamber within the plasma etching apparatus, and high-frequency bias potential is provided via a structure mentioned earlier (hereinafter called electrostatic chuck) capable of attracting the processing substrate electrostatically to draw the ions in the plasma toward the processing substrate. One example of such apparatus is disclosed in Japanese Patent Application Laid-Open Publication No. 2004-193564 (patent document 1).

Though the art disclosed in patent document 1 refers to utilizing the current and voltage of the processing substrate or the computed values thereof in order to monitor the voltage waveform applied to the processing substrate, it does not teach sufficiently how to compute the voltage waveform of the processing substrate based on the monitored values. Therefore, it was actually difficult to control the voltage of the processing substrate to achieve a desired waveform.

In an electrostatic chuck, since a DC-like high voltage must be applied to the electrode within the electrostatic chuck, it was impossible to measure the bias potential applied to the processing substrate directly, and only the voltage of the electrostatic chuck mechanism or the output power and reflecting power of the bias power supply were measured. The above-mentioned prior art had a drawback in that since there is no sufficient means for measuring the bias potential applied to the processing substrate, the controllability of the bias potential was not good. Thus, there were cases in which the accuracy and quality of the plasma etching process performed to the processing substrate were not improved sufficiently.

SUMMARY OF THE INVENTION

The object of the present invention is to provide a plasma processing apparatus and a plasma processing method capable of controlling the voltage of the processing substrate with high accuracy, thereby realizing accurate plasma processing.

In order to achieve the above objects, the present invention provides a plasma processing apparatus for subjecting a processing substrate to plasma processing, the apparatus comprising a processing chamber for storing the processing substrate; a substrate electrode having an electrostatic chuck mechanism for attracting and supporting the processing substrate electrostatically; a plasma generating means for supplying plasma to the processing substrate; a bias voltage applying means for applying bias voltage to the processing substrate placed on the substrate electrode; and an impedance value storage means for storing an impedance value of the electrostatic chuck mechanism, the impedance value acquired by measuring a voltage of a processing substrate for measurement placed on the substrate electrode, and using a capacity component of the electrostatic chuck mechanism, the bias voltage applied to the electrostatic chuck mechanism and a bias current flowing through the electrostatic chuck mechanism; wherein the voltage of the processing substrate to be subjected to plasma processing is estimated using the bias voltage value and the bias current value applied to the processing substrate actually subjected to plasma processing, and using the acquired impedance value of the electrostatic chuck mechanism.

According further to the plasma processing apparatus of the present invention, a power supply output of the bias voltage applying means is controlled using an estimated potential of the processing substrate.

According further to the plasma processing apparatus of the present invention, the impedance value storage means takes in and stores the bias voltage and the bias current applied to the electrostatic chuck mechanism, and further stores the impedance value representing the electric property of the electrostatic chuck mechanism; the means for estimating the voltage value of the processing substrate estimates the voltage value of the processing substrate based on the voltage and the current applied to the electrostatic chuck mechanism and the impedance value representing the electric property of the electrostatic chuck mechanism stored in the impedance value storage means; and the apparatus further comprising a control unit for generating a control signal for the bias voltage applying means and providing the same to the bias voltage applying means based on the estimated voltage value of the processing substrate estimated by the means for estimating the voltage value of the processing substrate.

According further to the plasma processing apparatus of the present invention, the waveform of the bias voltage value of the processing substrate is controlled so as to planarize a sag in the voltage of the processing substrate.

Further, in order to solve the problems of the prior art, the present invention provides a plasma processing method for subjecting a processing substrate to plasma processing, the method comprising: storing a processing substrate in a processing chamber, attracting and supporting the processing substrate electrostatically on an electrostatic chuck mechanism of a substrate electrode, providing plasma to the processing substrate from a plasma generating means, and supplying bias voltage to the processing substrate on the substrate electrode from a bias voltage applying means; further comprising acquiring an impedance value of the electrostatic chuck mechanism by measuring a voltage of a processing substrate for measurement placed on the substrate electrode, and using a capacity component of the electrostatic chuck mechanism, the bias voltage applied to the electrostatic chuck mechanism and a bias current flowing through the electrostatic chuck mechanism, and storing the acquired impedance value of the electrostatic chuck mechanism in an impedance value storage means; and estimating the voltage of the processing substrate to be subjected to plasma processing using the bias voltage value and the bias current value applied to the processing substrate actually subjected to plasma processing, and using the acquired impedance value of the electrostatic chuck mechanism.

The plasma processing method of the present invention further comprises controlling a power supply output of the bias voltage applying means using an estimated potential of the processing substrate. The plasma processing method of the present invention even further comprises controlling the waveform of the bias voltage value of the processing substrate so as to planarize a sag in the voltage of the processing substrate.

According further to the plasma processing method of the present invention, the impedance value storage means takes in and stores the bias voltage and the bias current applied to the electrostatic chuck mechanism, and further stores the impedance value representing the electric property of the electrostatic chuck mechanism; the means for estimating the voltage value of the processing substrate estimates the voltage value of the processing substrate based on the voltage and the current applied to the electrostatic chuck mechanism and the impedance value representing the electric property of the electrostatic chuck mechanism stored in the impedance value storage means; and further comprising generating a control signal for the bias voltage applying means and providing the same to the bias voltage applying means via a control unit based on the estimated voltage value of the processing substrate estimated by the means for estimating the voltage value of the processing substrate.

The effects of the present invention are as follows.

According to the present invention, a processing substrate for measurement placed on the substrate electrode is used to measure the voltage of the processing substrate, and through use of the capacity component of the electrostatic chuck mechanism, the bias voltage applied to the electrostatic chuck mechanism and the bias current flowing through the electrostatic chuck mechanism, the impedance value of the electrostatic chuck mechanism is acquired. The acquired impedance value is stored, and the voltage of the processing substrate to be subjected to plasma processing is estimated based on the bias voltage value and the bias current value applied to the processing substrate actually subjected to plasma processing and the acquired impedance value of the electrostatic chuck mechanism. According to this configuration, the present invention can control the voltage of the processing substrate with high accuracy in a plasma processing apparatus, and therefore, the present invention can realize highly accurate plasma processing in an effective manner. By controlling the computed voltage or current of the processing substrate via the bias power supply, it becomes possible to effectively improve the accuracy and quality of the plasma etching process of the processing substrate.

BRIEF DESCRIPTION OF THE DRAWINGS

FIG. 2 is an explanatory view showing the peripheral structure of the substrate electrode according to the present invention;

DETAILED DESCRIPTION OF THE PREFERRED EMBODIMENTS

Figure 1:
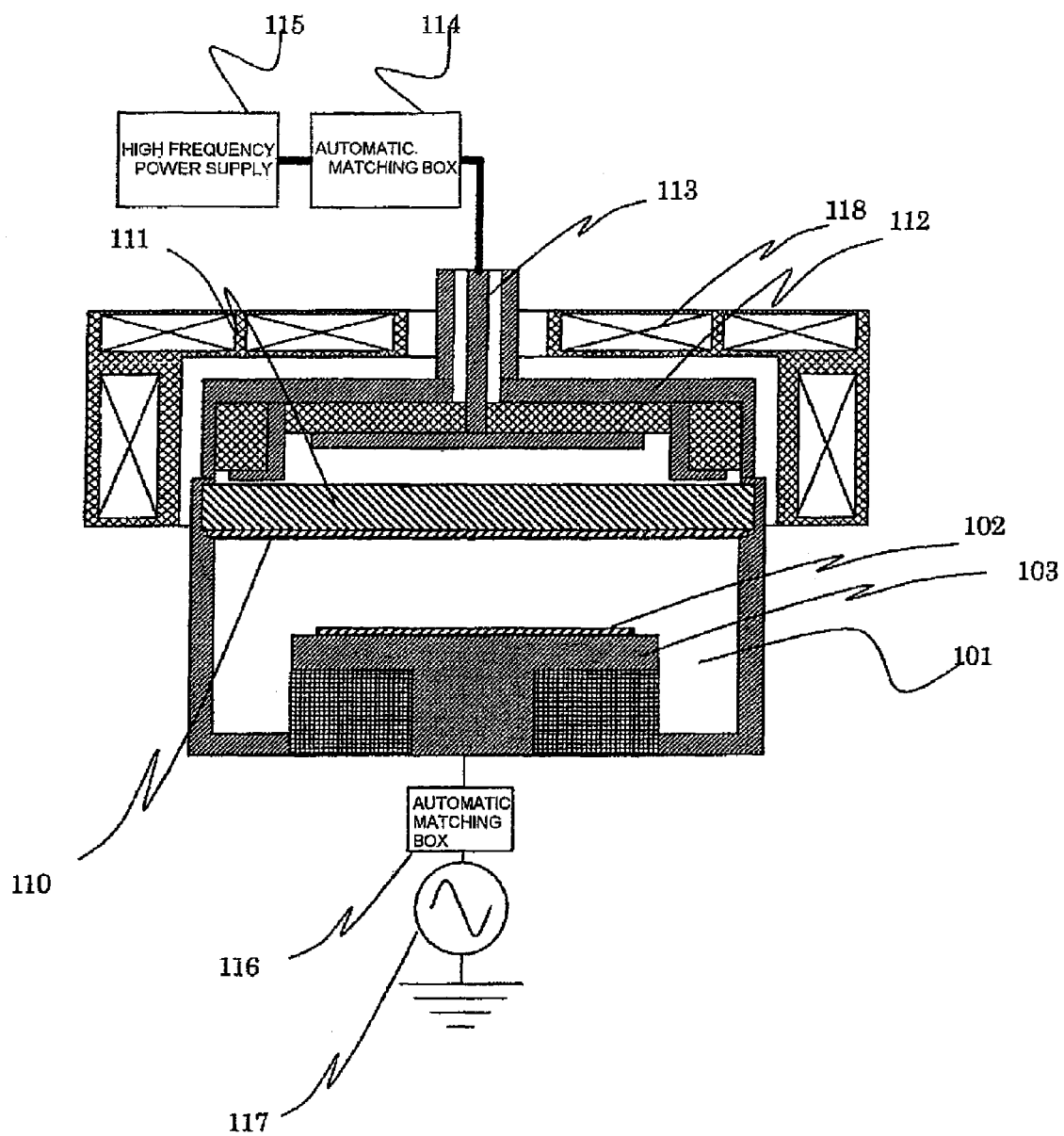
FIG. 1 is a cross-sectional view showing one embodiment of the plasma processing apparatus to which the present invention is applied.

Now, the preferred embodiments of the present invention will be described in detail with reference to the drawings. A plasma etching apparatus will be described as a first embodiment to which the plasma processing apparatus of the present invention is applied. FIG. 1 shows a schematic view of the plasma etching apparatus used in the present embodiment. In the plasma processing apparatus shown in FIG. 1, a high-frequency power generated by a high-frequency power supply 115 is supplied via an automatic matching box 114 and a coaxial line 113 to an antenna 112. The oscillating frequency of the high-frequency power supply 115 is 450 MHz.

The high frequency radiation irradiated from the antenna 112 of FIG. 1 is introduced through an electromagnetic wave introduction window 111 and a shower plate 110 into a processing chamber 101. A processing gas supply system and a vacuum exhaust system are connected to the processing chamber 101. The interior of the processing chamber 101 can be controlled to a pressure and gas atmosphere suitable for performing plasma etching process by feeding a predetermined flow rate of gas suitable for processing and evacuating the chamber. The processing gas is supplied via a shower-like state into the processing chamber 101 through the shower plate 110, and the gas flow within the processing chamber 101 is controlled to have a predetermined distribution suitable for processing.

Electromagnets 118 for generating magnetostatic field are disposed around the processing chamber 101 of FIG. 1, wherein the electromagnets 118 are capable of applying a magnetostatic field to the interior of the processing chamber 101. It is known that when a magnetostatic field of 0.016 tesla is applied to a high-frequency power with a frequency of 450 MHz, the cyclotron frequency of the electrons in the plasma within the processing chamber 101 becomes 450 MHz, and an electron cyclotron resonance phenomenon occurs in which electromagnetic waves are absorbed intensely in a resonating manner. According to this electron cyclotron resonance phenomenon, the plasma generation becomes possible even in an extremely low pressure area in which plasma cannot be generated normally, and the conditions for performing plasma etching to a processing substrate 102 are advantageously expanded.

Moreover, since generation of plasma tends to become intense at a position in which the field becomes 0.016 tesla causing electron cyclotron resonance, it becomes possible to control the plasma generating position by controlling the position in which the field becomes 0.016 tesla.

Another effect for forming an electromagnetic field in the processing chamber 101 using the electromagnet 118 of FIG. 1 is that the electrons in the plasma are constrained by the electromagnetic field, so that it becomes possible to control the dispersion of plasma within the processing chamber 101, and to control the plasma density distribution in the processing chamber 101 by the plasma dispersion control. According to the present embodiment, three electromagnets 118 are arranged coaxially around the coaxial line 113, by which the controllability of the magnetostatic field is improved and the controllability of the plasma density distribution is thereby improved.

A substrate electrode 103 on which the processing substrate 102 is to be placed is disposed in the processing chamber 101 of FIG. 1. A bias power supply 117 for applying a bias potential to the processing substrate 102 is connected via an automatic matching box 116 to the substrate electrode 103. The oscillating frequency of the bias power supply 117 is 400 KHz.

FIG. 2 shows in further detail the configuration around the substrate electrode 103. An electrostatic chuck mechanism 200 is used to retain the processing substrate 102 on the substrate electrode 103. The electrostatic chuck electrode 200 is mainly composed of a dielectric layer 204, an electrode layer 205 embedded in the dielectric layer 204 and a base layer 206. A DC power supply 203 for applying DC current is connected via a band rejection filter 209 to the electrode layer 205.

The substrate electrode 103 of FIG. 2 comprises a susceptor 201 and an electrode cover 202. The susceptor 201 is disposed around the processing substrate 102, and the electrode cover 202 is disposed under the susceptor 201, by which the whole structure is covered. The susceptor 201 is disposed so as to control the surface conditions of the surrounding areas of the processing substrate 102, and in the present embodiment, quartz is used as the material for the susceptor 201. Anodized aluminum is used as the material for the electrode cover 202.

A voltage in the order of a few hundred bolts in the positive or negative side is applied by the DC power supply 203 to the substrate electrode 103 of FIG. 2, so as to chuck the processing substrate 102 thereto via electrostatic force. The voltage from the DC power supply 203 is applied to the electrostatic layer 205. The dielectric layer 204 is mainly composed of a material having relatively high insulation property such as alumina ceramic, and formed of a composite of materials such as silicon dioxide and titanic oxide.

Charge is induced in the processing substrate 102 by the voltage from the DC power supply 203, and the processing substrate 102 is held by electrostatic chuck via the electrostatic force. In order to prevent bias current of the bias power supply 117 from entering, the DC power supply 203 includes a band rejection filter 209 to prevent current of the bias power supply 117 from entering.

The voltage and current supplied from the bias power supply 117 of FIG. 2 can be monitored respectively via a voltage monitor (voltmeter) 207 and a current monitor (ammeter) 208.

The bias power from the bias power supply 117 is applied to the base layer 206 of the electrostatic chuck mechanism 200, and applied via the electrostatic chuck mechanism 200 to the processing substrate 102. Usually, the electrostatic chuck mechanism 200 is designed so that the size of the impedance with respect to high frequency is small, and it is essentially composed of a thin insulating film layer, so it functions electrically as a capacitor with a large capacity.

Essentially, it is desirable to monitor the surface potential of the processing substrate 102 and to control the bias voltage output of the bias power supply 117 or the like based on the monitored potential value (voltage value) of the surface of the processing substrate 102, but since bias power is fed to the processing substrate 102 via the electrostatic chuck mechanism 200 as described earlier, it is actually difficult to directly measure the potential of the surface of the processing substrate 102.

Therefore, often only the voltage and power applied to the electrostatic chuck mechanism 200 are measured, neglecting the voltage drops and power losses in the electrostatic chuck mechanism 200.

However, if the bias current flowing through the electrostatic chuck mechanism 200 is large or the size of the impedance of the electrostatic chuck mechanism 200 is large, the voltage drops caused by the electrostatic chuck mechanism 200 may no longer be neglected.

Moreover, if the waveform of the bias power supply output is not sinusoidal but includes multiple frequency components, the impedance of the electrostatic chuck mechanism differs with respect to each frequency component, causing waveform distortion. An expression method called a peak-to-peak voltage is often used to represent the size of the voltage repeatedly varied in time. The peak-to-peak voltage refers to the value obtained by subtracting a minimum value of voltage from the maximum value. However, by using only the peak-to-peak voltage, the size of the voltage is hardly expressed accurately if waveform distortion occurs, and therefore, it becomes difficult to control the plasma processing properties of the processing substrate 102 in a stable manner.

Therefore, according to the present embodiment, in order to accurately monitor the bias voltage applied to the processing substrate 102, the bias voltage on the surface of a substrate for measurement is measured using a substrate for measurement having a voltage-measuring probe attached thereto, the impedance which is an electric property of the electrostatic chuck mechanism 200 is acquired in advance, and the bias voltage and bias current of the monitored bias power supply 117 of the processing substrate 102 to be actually processed monitored by the voltage monitor 207 and the current monitor 208 are used to compute and estimate the bias voltage of the processing substrate 102 to be actually processed.

Figure 3A:
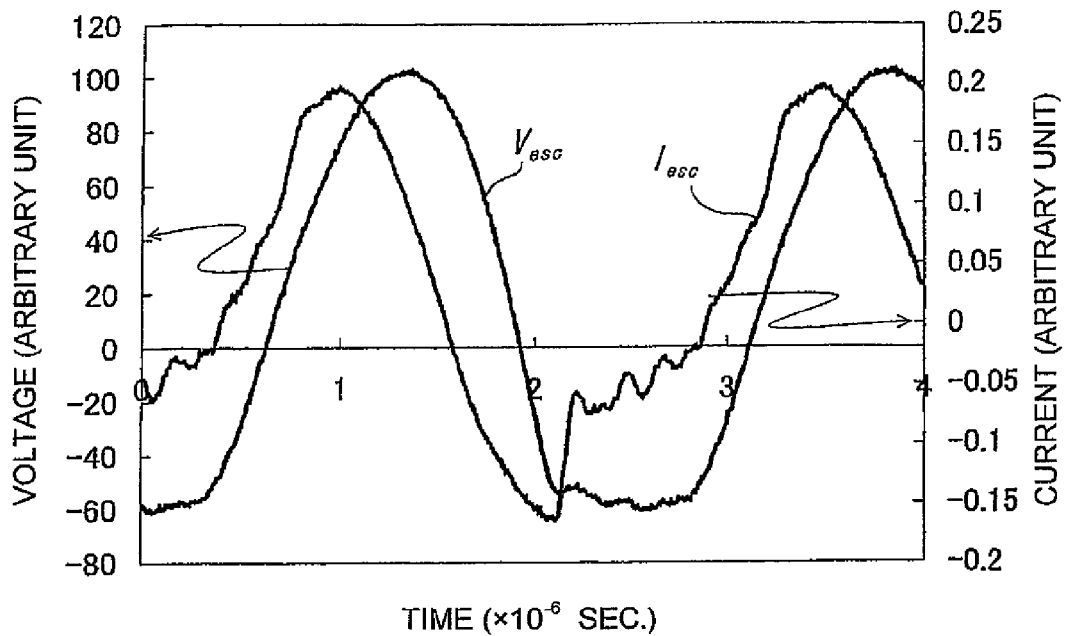
FIGS. 3A and 3B are views showing the measured values of voltages and currents of portions of the substrate electrode, and estimated values of the processing substrate voltage according to the present invention.
Figure 3B:
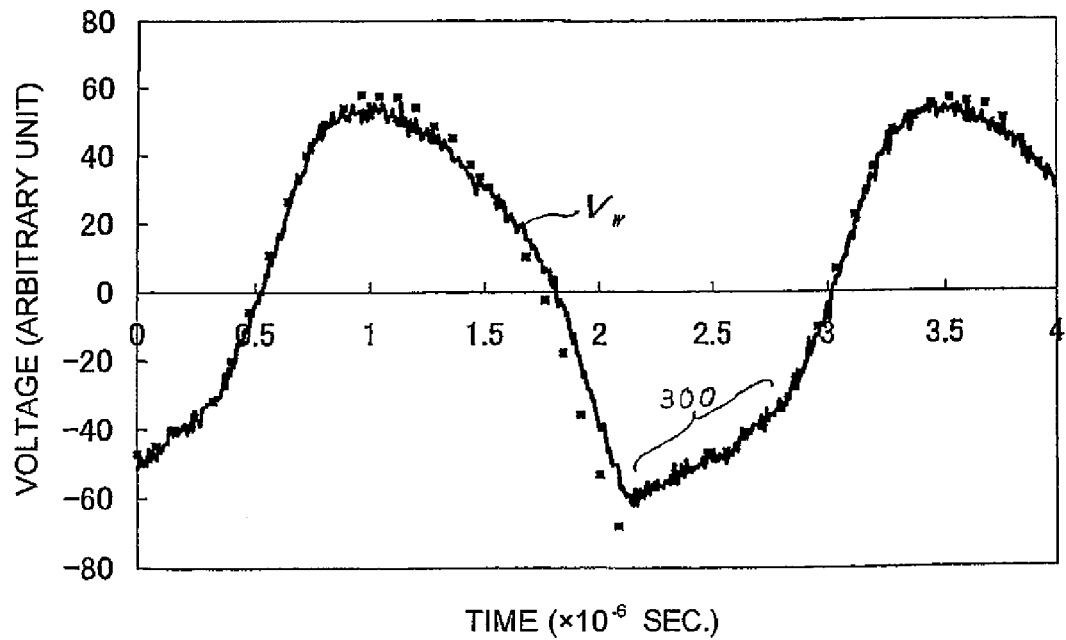

FIGS. 3A and 3B show the measurement results of the bias voltage and the bias current performed to measure the electric property of the electrostatic chuck mechanism 200. In FIG. 3A, the horizontal axis represents time and the vertical axis represents voltage and current. In FIG. 3B, the horizontal axis represents time and the vertical axis represents voltage.

In addition to the voltage monitor 207 and the current monitor 208, a substrate for measurement with a voltage-measuring probe is disposed on the substrate electrode 103 of FIG. 2, and the bias voltages and bias currents of portions of the electrostatic chuck mechanism 200 are measured.

The changes of bias voltage Vesc and bias current Iesc with time measured by the voltage monitor (voltmeter) 207 and the current monitor (ammeter) 208 of FIG. 2 are shown in FIG. 3A. In addition, the measurement result of the voltage on the substrate for measurement is shown in FIG. 3B.

The waveform of voltage Vesc applied to the electrostatic chuck mechanism 200 is not sinusoidal but has its negative side of the voltage clipped, as shown in FIG. 3A. In this case, since the electrostatic chuck mechanism 200 has capacitative impedance, the low-frequency components do not easily permeate, so the waveform of voltage Vw on the processing substrate has a gradient called a sag 300 corresponding to the clipped portion, as shown in FIG. 3B. By controlling the waveform of the bias voltage Vesc so as to planarize the sag 300, it becomes possible to achieve a uniform ion energy, by which the efficiency and accuracy of the plasma etching process are improved.

Based on the voltage waveform and the current waveform shown in FIGS. 3A and 3B, the capacity Cesc of the electrostatic chuck mechanism 200 can be computed numerically by the following procedure.

Figure 4:
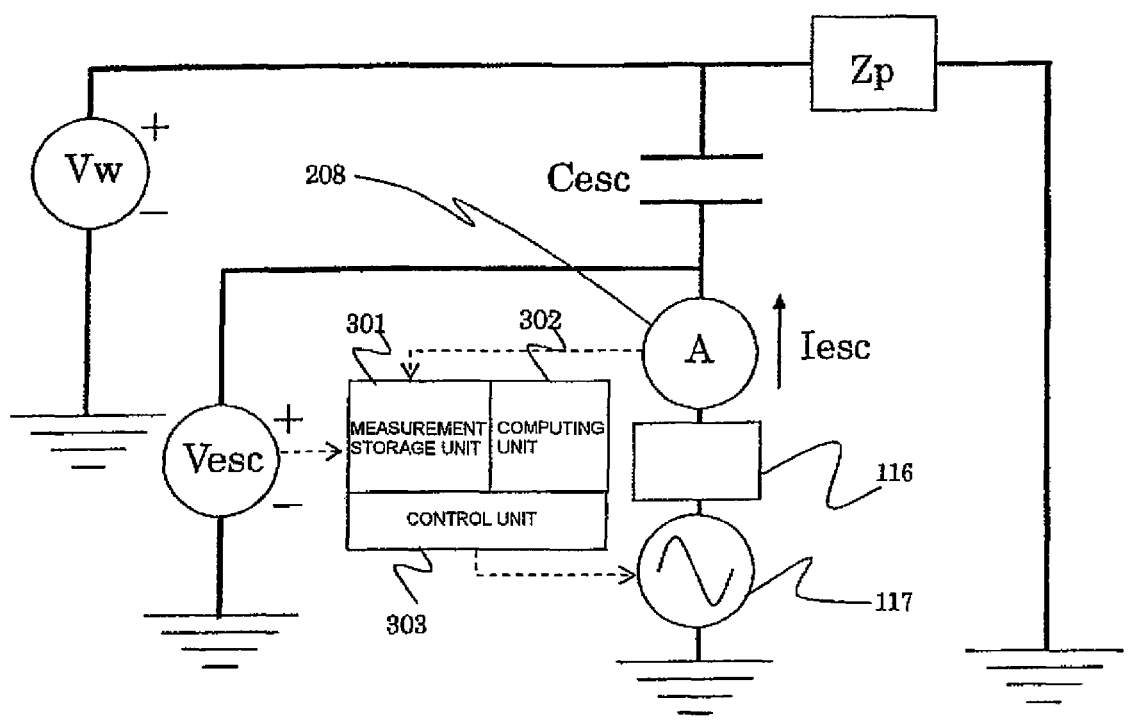
FIG. 4 is a view showing the equivalent circuit model of the peripheral area of the substrate electrode according to the present invention.

The path through which the current from the bias power supply 117 of FIG. 2 passes is modeled in the equivalent circuit shown in FIG. 4. In FIG. 4, a measurement storage unit 301 is a means for taking in and storing the voltage value and the current value applied to the electrostatic chuck mechanism 200, and also storing the capacity Cesc which is an impedance value representing the electric property of the electrostatic chuck mechanism 200.

A computing unit 302 of FIG. 4 is a means for estimating the voltage value of the processing substrate using expression (1) or expression (2), based on the voltage value and current value applied to the electrostatic chuck mechanism 200 and the impedance value representing the electric property of the electrostatic chuck mechanism 200, which are stored in the measurement storage unit 301.

Moreover, the control unit 303 of FIG. 4 is a means for creating a control signal for the bias power supply 117 and providing the same to the bias power supply 117 based on the estimation on the voltage value of the processing substrate estimated in the computing unit 302.

Now, when assuming that the capacity component representing the impedance value of the electrostatic chuck mechanism 200 is Cesc, the bias voltage applied to the electrostatic chuck mechanism 200 shown in FIG. 3A is Vesc, the bias current flowing through the electrostatic chuck mechanism 200 shown in FIG. 3A is Iesc, the voltage of the processing substrate 102 shown in FIG. 3B is Vw and the impedance of the path from the processing substrate 102 to the earth potential is Zp, the voltage Vw of the processing substrate 102 can be represented by the following expression (1) via a time domain method. In expression (1), A represents an integral constant.

[Expression 1]

$$V_w = V_{esc} - \frac{1}{C_{esc}} \int I_{esc} dt + A \quad (1)$$

The above expression (1) can be expressed via a frequency domain method by the following expression (2).

[Expression 2]

$$V_W = V_{esc} - I_{esc}/j\omega C_{esc} \quad (2)$$

The voltage Vw of the processing substrate estimated by expression (1) and the actually measured voltage of the processing substrate are compared, and based on the fact that the error between both values is minimum in the least squares method, the capacity component Cesc which is the impedance of the electrostatic chuck mechanism 200 is computed, and further based on the capacity component Cesc of the electrostatic chuck mechanism 200, the voltage of the processing substrate calculated by expression (1) (estimated value of the processing substrate voltage) is computed. As for expression (2) regarding the frequency domain, the voltage Vw of the processing substrate 102 can be estimated by disassembling the object into respective frequency components via Fourier series expansion, applying expression (2) to the respective frequency components and superimposing them.

FIG. 3B shows the voltage of the processing substrate computed by expression (1) (estimated value of the processing substrate voltage), together with the actually measured voltage value of the processing substrate. The actual measurement values are shown by the solid line, and the estimated values are shown by squares.

As shown in FIG. 3B, it has been confirmed that the actual measurement values of the voltage of the processing substrate correspond well with the waveform of the estimated value of the processing substrate voltage based on expression (1). Error evaluation methods other than the mean squared method may use other criteria, such as the summation of the absolute value of the difference between the estimated value of the processing substrate voltage and the actually measured value of the processing substrate voltage.

Experimentally, it is possible to prepare a processing substrate with a voltage probe formed by disposing a voltage probe on a processing substrate for measurement, and measure the voltage of the processing substrate directly. However, during normal operation of the plasma etching process, it is often actually impossible to dispose a voltage probe on each processing substrate.

Therefore, as mentioned earlier, the voltage Vw of the processing substrate is measured directly in advance using the processing substrate with a voltage probe, and based on the bias voltage Vesc applied to the electrostatic chuck mechanism 200 shown in FIG. 3A and the bias current Iesc flowing through the electrostatic chuck mechanism 200 shown in FIG. 3A, the capacity component Cesc which is the impedance representing the electric property of the electrostatic chuck mechanism 200 of FIG. 2 is computed numerically.

Then, by utilizing the bias voltage Vesc of the processing substrate 102 to be actually measured, the bias current Iesc flowing through the electrostatic chuck mechanism 200 and the numeral of the capacity component Cesc which is the impedance of the electrostatic chuck mechanism 200 acquired in advance are used to effectively estimate the voltage Vw of the processing substrate 102 based on expression (1). However, the bias current Iesc varies according to plasma generating conditions.

The ions in the plasma are drawn toward the processing substrate 102 by the voltage applied to the processing substrate 102 by the bias power supply 117 of FIG. 2, according to which the plasma etching configuration and the plasma etching rate are controlled. Therefore, the voltage of the processing substrate 102 is one of the important parameters that determine the plasma etching property. By monitoring the voltage waveform of the processing substrate, it becomes possible to accurately control the plasma etching properties.

According to the present embodiment, since the electrostatic chuck mechanism 200 has capacitative impedance, it can be modeled via expression (1). If the impedance of the electrostatic chuck mechanism 200 can be expressed via a circuit in which the resistance component Resc, the capacity component Cesc and the induction component Lesc are connected in series, the following expression (3) can be used, that corresponds to expression (1).

[Expression 3]

$$V_w = V_{esc} - R_{esc} I_{esc} - L_{esc} \frac{dI_{esc}}{dt} - \frac{1}{C_{esc}} \int I_{esc} dt + A \quad (3)$$

Similarly, by actually measuring the voltage Vw of the processing substrate with a voltage probe and comparing the same with the estimated value from expression (3), the resistance component Resc, the capacity component Cesc and the induction component Lesc can be computed so as to compute the estimated value of the voltage Vw of a normal processing substrate. In addition, another possible method for measuring the resistance component Resc, the capacity component Cesc and the induction component Lesc is a measurement method using an impedance analyzer.

As descried, the plasma etching apparatus according to the prior art controls the bias power applied to the electrostatic chuck mechanism 200 to a predetermined value, and monitors the peak-to-peak voltage of the voltage applied to the electrostatic chuck mechanism. If the waveform of the bias voltage is not sinusoidal but includes multiple frequency components, as mentioned earlier, the voltage waveform applied to the processing substrate is distorted due to the frequency characteristics of the electrostatic chuck mechanism. In addition, if the bias current is large due to causes such as high plasma density, the voltage drop at the electrostatic chuck mechanism is neglected, so there is a drawback in that the voltage of the processing substrate considered to affect the plasma etching property directly cannot be monitored with high accuracy according to the prior art. From the viewpoint of controlling the plasma etching property, it is preferable for the voltage applied to the processing substrate to be controlled directly.

Therefore, according to the present invention, the electric property of the electrostatic chuck mechanism is measured in advance, and the voltage and current of the electrostatic chuck mechanism during actual processing of the processing substrate are measured so as to compute the voltage and current of the processing substrate. It is possible to overcome the prior art problems mentioned above by controlling the computed voltage or the current of the processing substrate via the bias power supply. In other words, since according to the present invention the controllability of the bias potential of the processing substrate is good, the accuracy and quality of the plasma etching process performed to the processing substrate is sufficiently improved.

The embodiment of the present invention adopts a control system capable of designating the voltage of the processing substrate monitored according to the above-mentioned monitoring method. By adopting a monitoring method using expression (1) and expression (3), it becomes possible to monitor the voltage of the processing substrate stably without depending on the conditions and density of plasma, so the plasma etching performance can be improved.

Furthermore, the present invention is not restricted to the above mentioned embodiment, and the present embodiment can be subjected to various modifications and changes within the scope of the present invention.

Moreover, a plasma etching apparatus is provided as an example of the plasma processing apparatus to which the present invention is applied, but the present invention is not restricted thereto.

What is claimed is:

1. A plasma processing method for subjecting a processing substrate to plasma processing, the method comprising the steps of:

storing a processing substrate in a processing chamber, attracting and supporting the processing substrate electrostatically on an electrostatic chuck mechanism of a substrate electrode, providing plasma to the processing substrate from a plasma generator, and supplying bias voltage to the processing substrate on the substrate electrode from a bias voltage supplier;

acquiring an impedance value of the electrostatic chuck mechanism by measuring a waveform of a voltage of a processing substrate for measurement placed on the substrate electrode, a waveform of the bias voltage supplied to the electrostatic chuck mechanism and a waveform of a bias current flowing through the electrostatic chuck mechanism, and storing the acquired impedance value of the electrostatic chuck mechanism in an impedance value storage device; and estimating a non-sinusoidal waveform of the voltage including multiple frequency components of the processing substrate to be subjected to plasma processing by a voltage waveform estimator, using a time domain model formula, using a non-sinusoidal waveform of the bias voltage including multiple frequency components and a non-sinusoidal waveform of the bias current including multiple frequency components applied to the processing substrate actually subjected to plasma processing, and using the acquired impedance value of the electrostatic chuck mechanism.

2. The plasma processing method according to claim 1, further comprising controlling a power supply output of the bias voltage supplier through use of an estimated potential of the processing substrate.

3. The plasma processing method according to claim 1, wherein the impedance value storage device takes in and stores the waveform of the bias voltage and the waveform of the bias current supplied to the electrostatic chuck mechanism, and further stores the impedance value representing an electric property of the electrostatic chuck mechanism;

wherein the voltage waveform estimator of the processing substrate estimates the waveform of the voltage of the processing substrate based on the waveform of the voltage and the waveform of the current supplied to the electrostatic chuck mechanism and the impedance value representing the electric property of the electrostatic chuck mechanism stored in the impedance value storage device; and wherein the method further comprises generating a control signal for the bias voltage supplier and providing the control signal to the bias voltage supplier via a control unit based on the estimated waveform of the voltage of the processing substrate estimated by the voltage waveform estimator of the processing substrate.

4. The plasma processing method according to claim 3, further comprising controlling the waveform of the bias voltage of the processing substrate so as to planarize a sag in the waveform of the voltage of the processing substrate.

* * * * *